United States Patent
Beehler

(10) Patent No.: US 11,138,137 B2
(45) Date of Patent: Oct. 5, 2021

(54) SELF-LEARNING APPARATUS FOR CONNECTING INPUTS AND OUTPUTS OF A PROGRAMMABLE LOGIC CONTROLLER TO A FIELD DEVICE

(71) Applicant: NELES USA INC., Fergus Falls, MN (US)

(72) Inventor: Robert A. Beehler, Fergus Falls, MN (US)

(73) Assignee: Neles USA Inc., Fergus Falls, MN (US)

(*) Notice: Subject to any disclaimer, the term of this patent is extended or adjusted under 35 U.S.C. 154(b) by 80 days.

(21) Appl. No.: 16/747,238

(22) Filed: Jan. 20, 2020

(65) Prior Publication Data
US 2021/0224207 A1 Jul. 22, 2021

(51) Int. Cl.
| | | |
|---|---|---|
| *G06F 13/20* | (2006.01) | |
| *G06N 20/00* | (2019.01) | |
| *G05B 19/05* | (2006.01) | |
| *G06F 13/40* | (2006.01) | |
| *H03K 19/177* | (2020.01) | |
| *H03K 19/0175* | (2006.01) | |

(52) U.S. Cl.
CPC .............. *G06F 13/20* (2013.01); *G05B 19/05* (2013.01); *G06F 13/4022* (2013.01); *G06N 20/00* (2019.01); *H03K 19/177* (2013.01); *G05B 2219/1105* (2013.01)

(58) Field of Classification Search
CPC .............. G06F 1/32; G05B 11/01; H02J 1/00
See application file for complete search history.

(56) References Cited

U.S. PATENT DOCUMENTS

| | | | |
|---|---|---|---|
| 7,822,896 B1 | 10/2010 | Sagues et al. | |
| 2006/0100758 A1* | 5/2006 | Katrak | B60R 16/005 701/36 |
| 2007/0268040 A1* | 11/2007 | Ohneda | G06F 1/3203 326/38 |
| 2008/0015421 A1* | 1/2008 | Penner | A61B 5/14539 600/300 |
| 2012/0042148 A1* | 2/2012 | Grunzke | G11C 7/10 711/211 |
| 2013/0278395 A1* | 10/2013 | Johnson | G05B 19/0423 340/12.5 |
| 2017/0093154 A1* | 3/2017 | Geng | H02J 1/00 |
| 2019/0041452 A1 | 2/2019 | Chang et al. | |
| 2019/0146543 A1 | 5/2019 | Baranwal et al. | |

OTHER PUBLICATIONS

ST Life, Augmented L6362A; IO-Link Communication Transceiver Device IC; Nov. 2017; pp. 1-39 DocID027660 Rev 10.

Extended European Search Report for corresponding application European Patent Application No. 20201733.1 dated Mar. 29, 2021, 13 pages.

* cited by examiner

*Primary Examiner* — Getente A Yimer
(74) *Attorney, Agent, or Firm* — Thomas J. Nikolai; DeWitt LLP

(57) ABSTRACT

Identification of the types of input and output cards of a PLC and proper connection of field devices to a PLC are achieved by connecting a self-learning discrete input circuit and/or a self-learning discrete output circuit between the PLC and the field device.

21 Claims, 13 Drawing Sheets

SELF-LEARNING APPARATUS FOR CONNECTING INPUTS AND OUTPUTS OF A PROGRAMMABLE LOGIC CONTROLLER TO A FIELD DEVICE

CROSS-REFERENCED TO RELATED APPLICATIONS

Not applicable

STATEMENT REGARDING FEDERALLY SPONSORED RESEARCH OR DEVELOPMENT

Not applicable

BACKGROUND OF THE INVENTION

I. Field of the Invention

The present invention relates generally to industrial control of field devices. The present invention relates more specifically to novel devices that are self-learning, able to identify the types of input and output cards used by a programmable logic controller (PLC), and able to adapt the signal paths between a field device and PLC based on the types of input and output card employed by the PLC to ensure the PLC and field device are properly connected.

II. Discussion of the Prior Art

A variety of field devices are commonly used in industrial applications. One example of a field device is a valve mechanically coupled to a solenoid which is employed to change the position of the valve, i.e., move the valve to its fully open position, fully closed position or a desired intermediate position between the valve's fully opened and fully closed positions. Such a field device may also include one or more sensors. Such sensors may, for example, be used to determine whether the valve is fully opened or fully closed or the degree to which the valve is open. Such sensors may also be used to determine the amount of flow through the valve.

Control of the operation of field devices, such as the valve described above, is often provided by a programmable logic controller (PLC). When the PLC is properly connected to the field device, the PLC receives signals from the sensor(s) of the field device. In response to those sensor signals, its internal programming and often inputs received from other sources, the PLC sends control signals to the solenoid to change the position of the valve.

Of course, proper connection of the field device to the PLC is essential for the PLC to receive signals from the sensors of the field device and for the PLC to deliver control signals to the field device. An improper connection will not only render the field device inoperable but may also cause damage to either the PLC or the field device.

Three types of input and output cards are typically employed by PLCs. These include NPN, PNP and Push-Pull configurable cards. The actuators (e.g., a solenoid) and sensors employed by field devices each typically include at least three pins to be connected to the PLC. These include a positive supply (V+), a supply return (V−), and a signal. These also are available in three forms, namely, NPN, PNP and Push-Pull configurable. It is necessary for proper connection of a field device to the PLC for the sensor type to match the card type. Likewise, the actuator should match the PLC card type to which it is connected.

For example, NPN sensors use an NPN or N-channel transistor to "sink" current into the signal pin when active. NPN sensors are adapted to be wired to a sourcing input card of a PLC that have an internal resistor pulled high (typically to 24V). When the sensor is signaling "inactive", the PLC card's pull-up resistor pulls the signal high, which is interpreted as a binary 0 by the processor of the PLC.

PNP sensors operate differently. PNP sensors use a PNP or P-channel transistor to "source" current into the signal pin when active. PNP sensors are used with "sinking" input PLC cards that have an internal resistor pulled low to 0V. When the sensor is signaling "inactive", the PLC card's pull-down resistor pulls the signal low, which is interpreted by the PLC's processor as a binary 0 by the processor of the PLC.

Push-Pull/configurable (PPC) sensors have both an NPN and a PNP style transistor that can be used with both sourcing and sinking style PLC input cards. However, there is inconsistency regarding whether the active state should be "active high" or "active low". The logic of the processor may be adjusted to select either "active high" or an "active low" as the active state.

In addition to the three pin sensors described above with a single signal pin, some devices include multiple signal pins such that more than three wires are used to connect the pins of the sensors to the PLC. Also, some manufacturers offer two wire (pin) sensors. These sensors can be wired to either NPN or PNP PLC cards, but they are not universally compatible with all PLC cards.

In addition to the various three wire inputs to the PLC cards discussed above, the outputs from the PLC to the field device vary. For example, two pins may be used to connect a solenoid to the PLC. One pin is always wired to either V+ or V−. the other pin is wired to the PLC's output card. Proper connection requires the user to know if the PLC supplies the V+ or the V− on its signal (output) line. The user will then also know whether to wire the other pin of the field device to V+ or V−. Similar problems exist with two pin solenoids.

As should be clear from the foregoing, given the variety of PLCs, sensor types and actuator types used in field devices, it is often difficult to properly connect a field device to a PLC.

There is a real need for an apparatus that is self-learning and that is able to ascertain and establish a proper connection between the input and output cards of PLCs and a field device.

SUMMARY OF THE INVENTION

The foregoing problems are solved by providing circuitry adapted to test, sense and ultimately determine the type of PLC card that is wired to each input and output of a field device. The circuitry resides between the PLC and the field device (or within either the PLC or field device). The circuitry auto-detects the type of PLC card(s). The apparatus does so by determining if the signal(s) are open circuit, short circuit, or have the expected (correct) impedance.

In its most simple form, the apparatus of the present invention includes one of two discrete circuit configurations. The first, referred to herein as the "DI", is a self-learning input adapted to identify the proper connection of a sensor output of a field device to an input card of a PLC. The second, referred to herein as the "DO", is a self-learning output adapted to identify the proper connection of field device's input to an output card of the PLC. The DI configuration includes a processor, which may be a separate processor, or the same processor employed by either the PLC or the field device. The DI configuration further includes a buffer, a pull-up resistor, a pull-down resistor, a pull-up switch, a pull-down switch, a drive-up switch and a drive-down switch. Each of the switches may be MOSFET switches adapted to be controlled by the processor. The processor, under program control, operates the switches to ascertain proper connection of a sensor of the field device to the PLC's input card. When the field device includes multiple sensors, duplicates of the DI configuration may be provided, one for each sensor.

The DO configuration also includes a processor which, again, may be a separate processor or the same processor employed by the PLC, the field device or the DI configuration. The DO configuration also includes a second buffer, a second pull-up switch, a second pull-down switch and a pull-up/pull-down resistor. The processor, under program control, operates the switches (which again may be MOSFET switches) to ascertain proper connection of an actuator of the field device to the PLC's output card. If the field device includes multiple actuators, the DO configuration may be duplicated such that there is a separate DO configuration for each actuator.

BRIEF DESCRIPTION OF THE DRAWINGS

The foregoing features, objects and advantages of the invention will become apparent to those skilled in the art from the following detailed description of the preferred embodiment, especially when considered in conjunction with the accompanying drawings in which like numerals in the several views refer to corresponding parts.

DESCRIPTION OF THE PREFERRED EMBODIMENT

Figure 1:
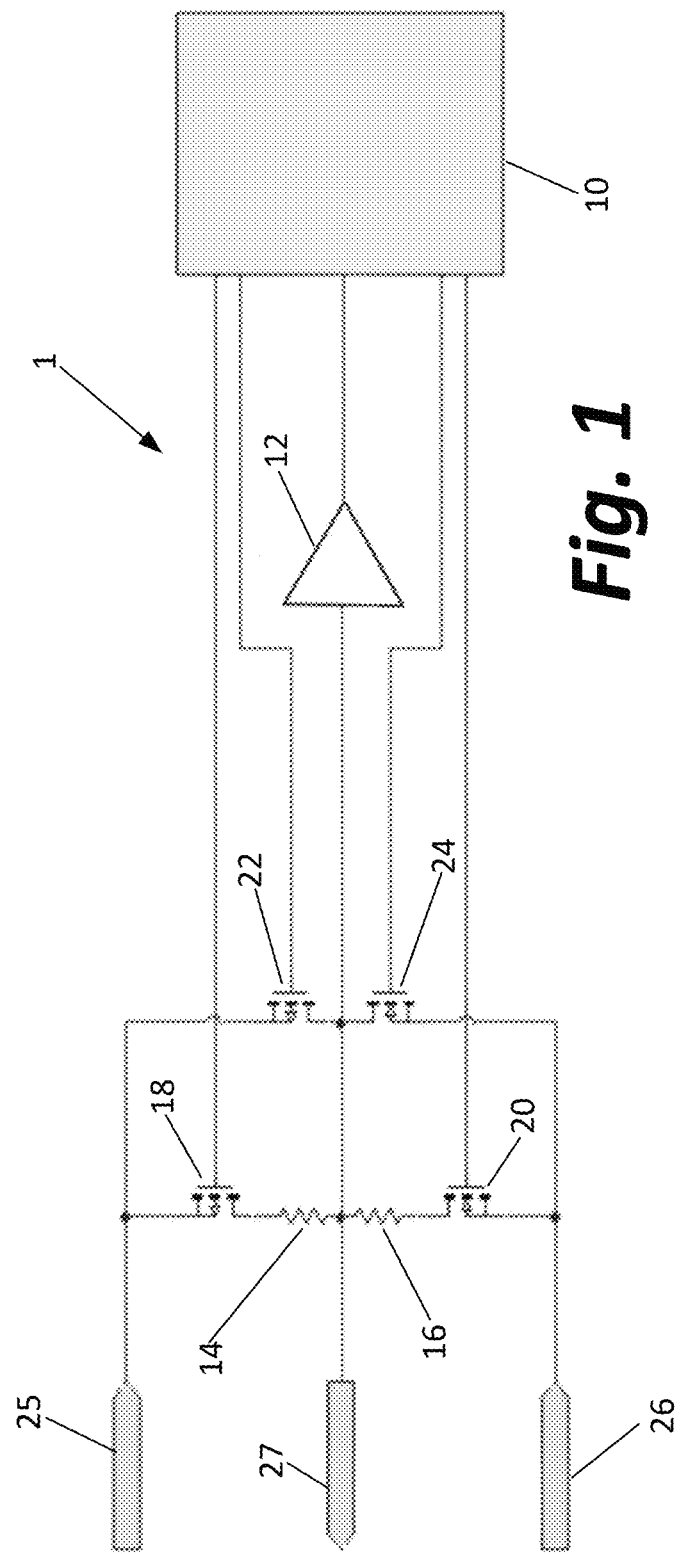
FIG. 1 is a schematic diagram of the direct input (DI) circuit of an embodiment of the present invention.

This description of the preferred embodiments is intended to be read in connection with the accompanying drawings, which are to be considered part of the entire written description of this invention. In the description, relative terms such as "lower", "upper", "horizontal", "vertical", "above", "below", "up", "down", "top" and "bottom" as well as derivatives thereof (e.g., "horizontally", "downwardly", "upwardly", etc.) should be construed to refer to the orientation as then described or as shown in the drawings under discussion. These relative terms are for convenience of description and do not require that the apparatus be constructed or operated in a particular orientation. Terms such as "connected", "connecting", "attached", "attaching", "join" and "joining" are used interchangeably and refer to one structure or surface being secured to another structure or surface or integrally fabricated in one piece, unless expressively described otherwise.

Figure 4:
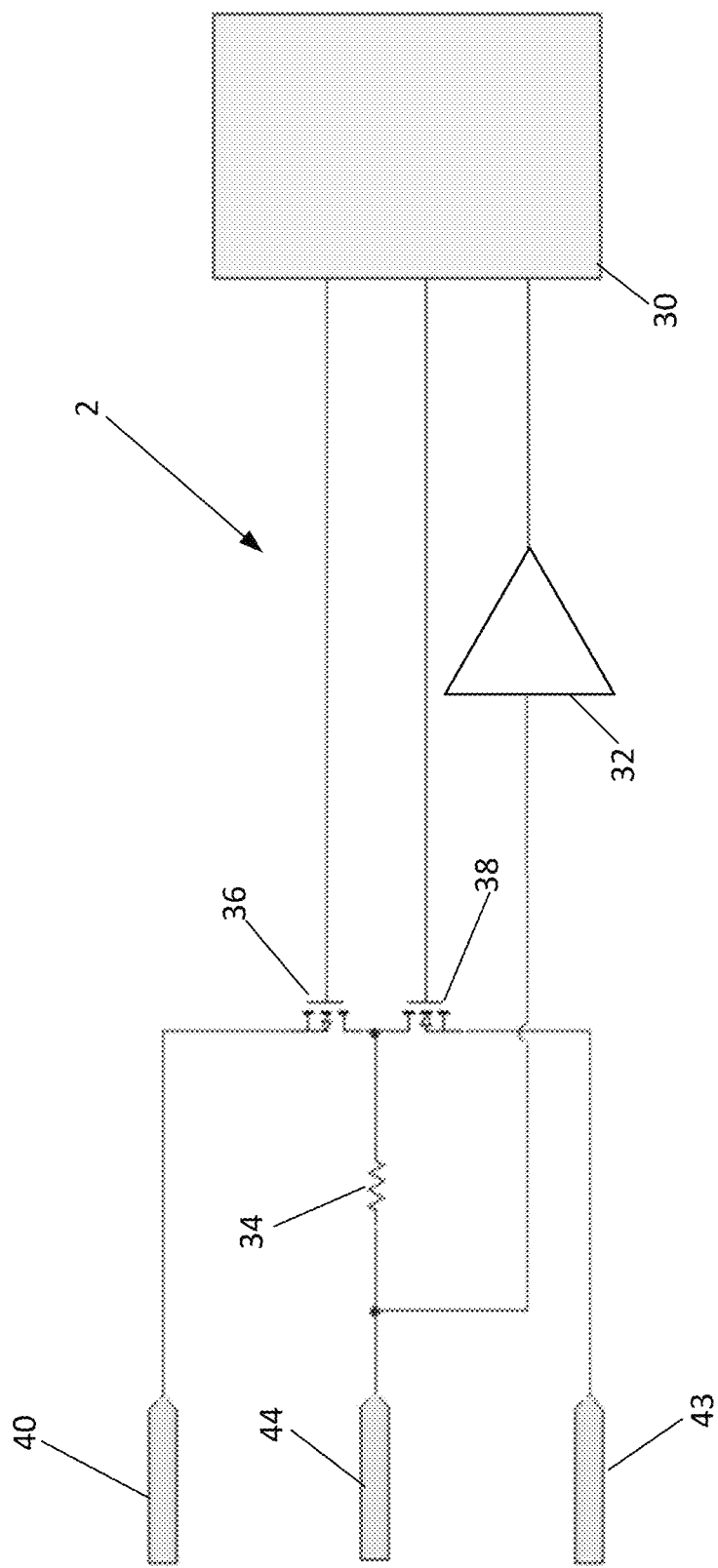
FIG. 4 is a schematic diagram of the direct output (DO) circuit of an embodiment of the present invention.
Figure 5:
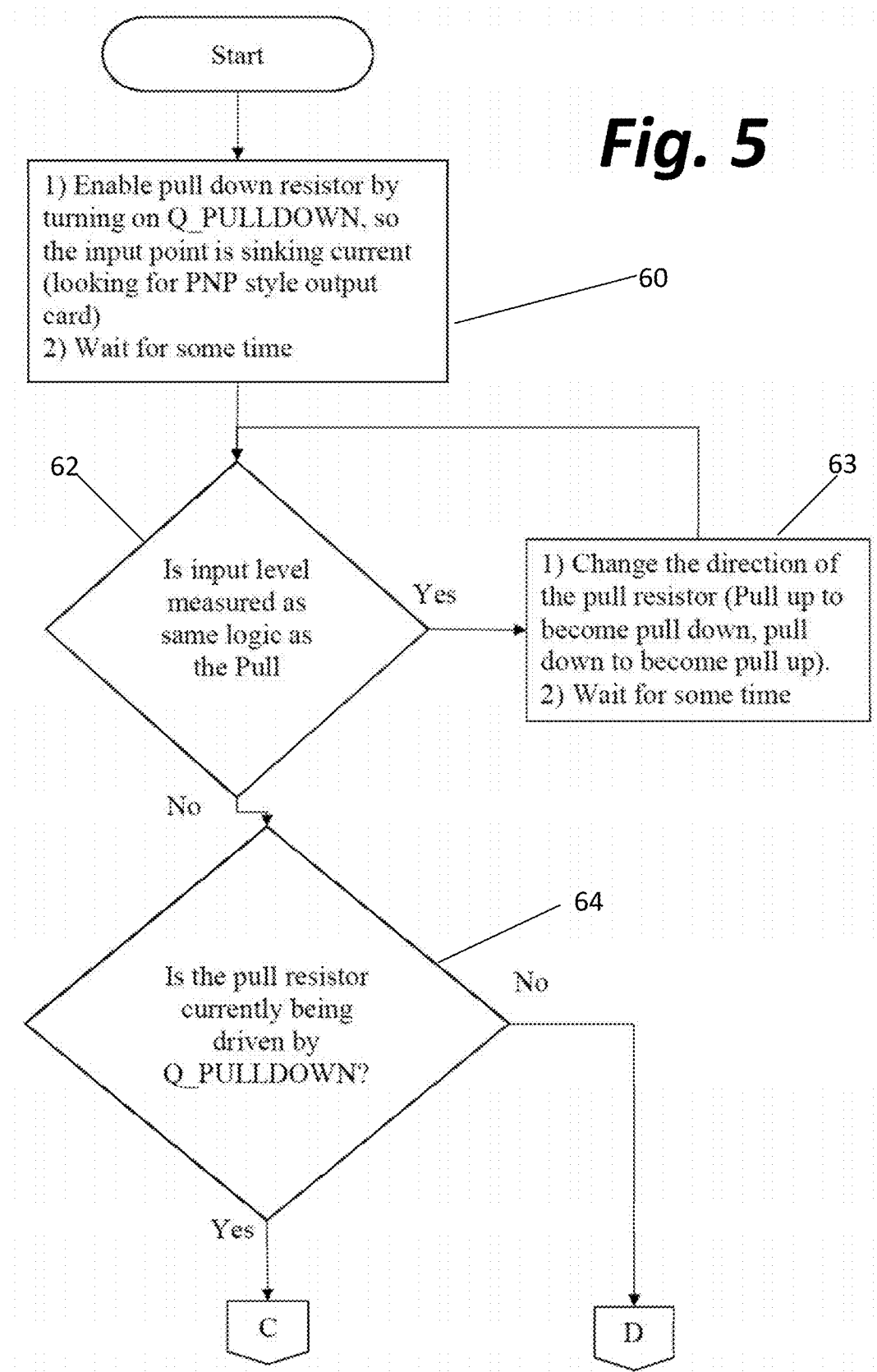
FIGS. 5-8 together illustrate a flow chart of the steps employed by the DO of FIG. 4 to ascertain the proper connection between the output card of a PLC and the input of an actuator.
Figure 6:
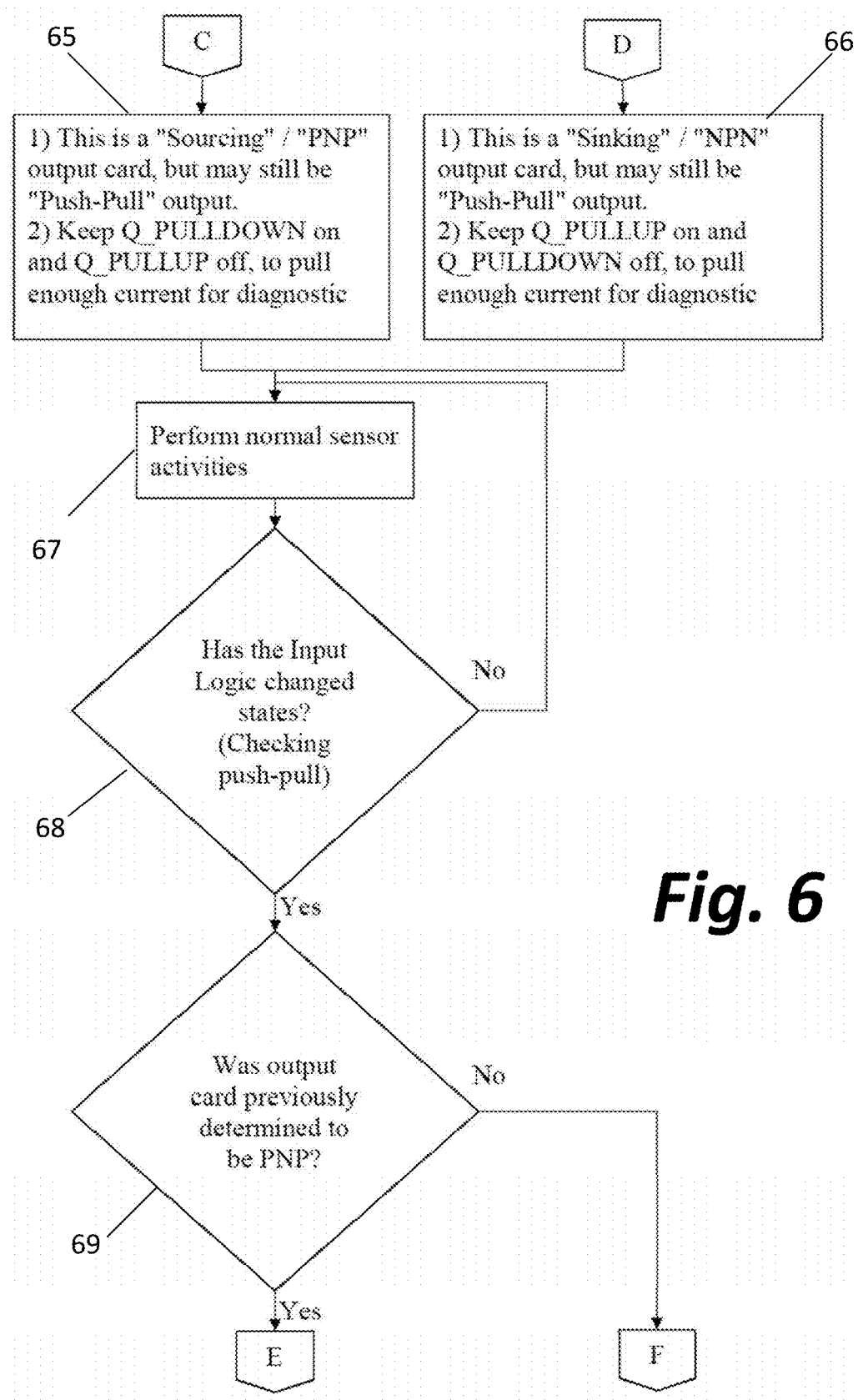
Figure 7:
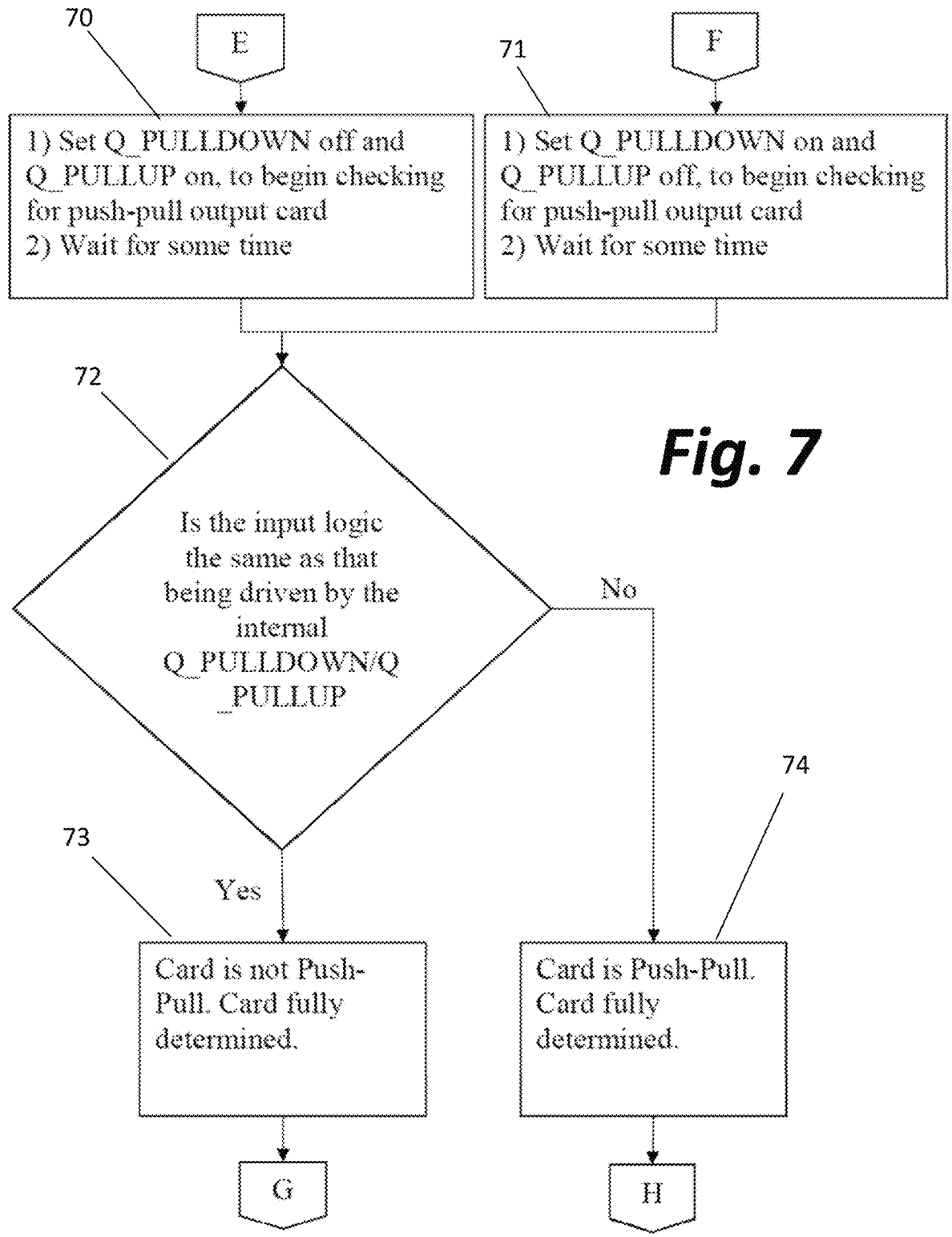
Figure 8:
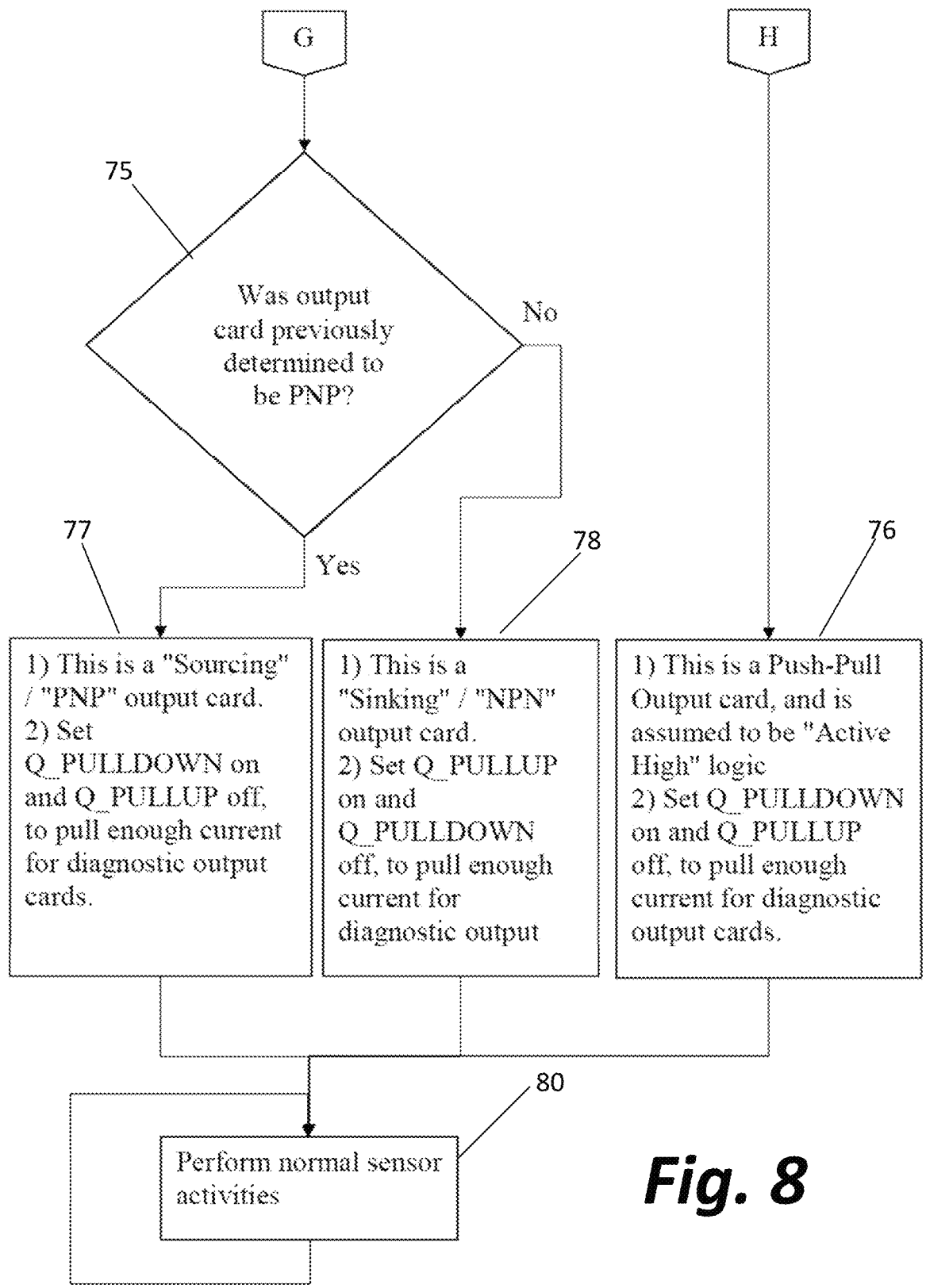

The apparatus of the present invention, in its simplest form, includes one of two discrete circuit configurations, either a discrete input circuit (DI) 1 such as that shown in FIG. 1 or a discrete output circuit (DO) 2 such as that shown in FIG. 4. In other forms, the apparatus includes both a DI circuit 1 and a DO circuit 2. In still other forms, the apparatus includes multiple DI circuits 1, or multiple DO circuits, or even multiple DI circuits and multiple DO circuits 2. See, e.g., FIGS. 11-13.

Figure 9:
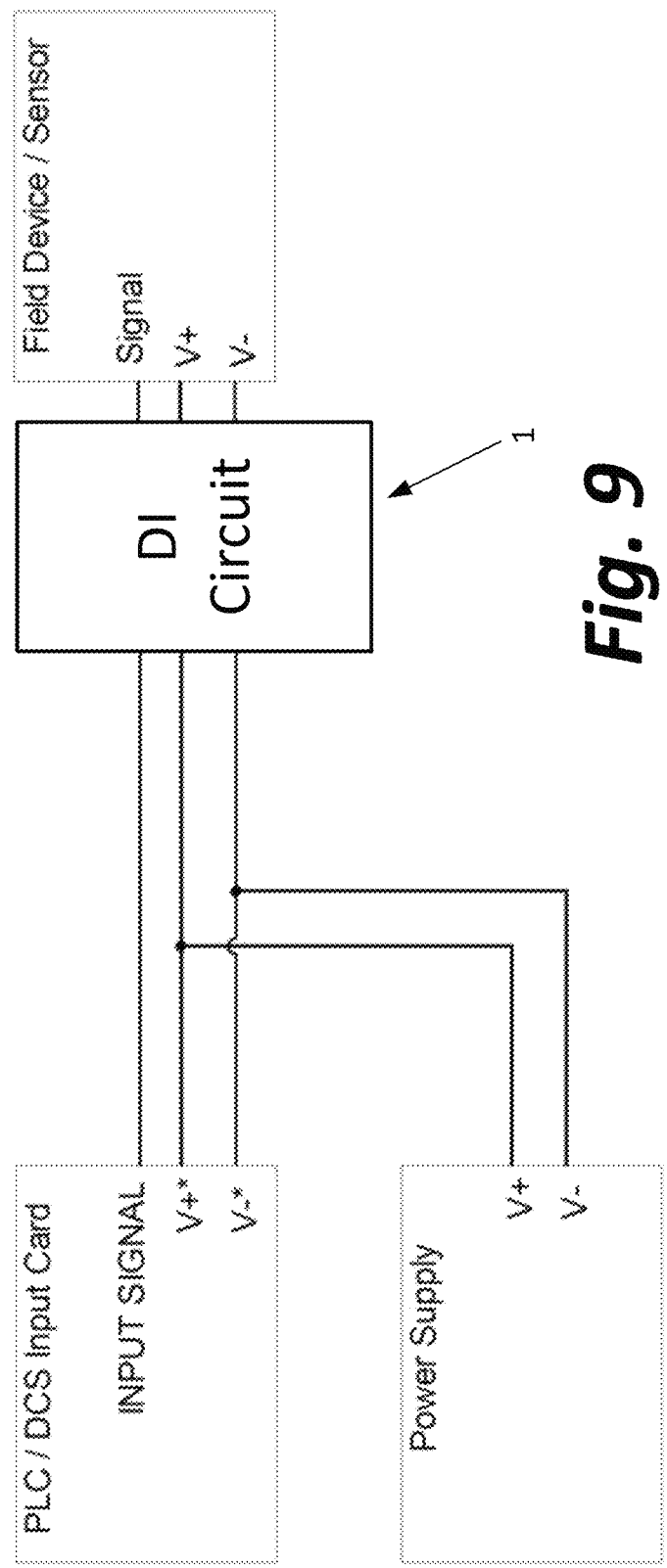
FIG. 9 is a schematic diagram showing the DI of FIG. 1 connected between an input card of a PLC and a field device.
Figure 10:
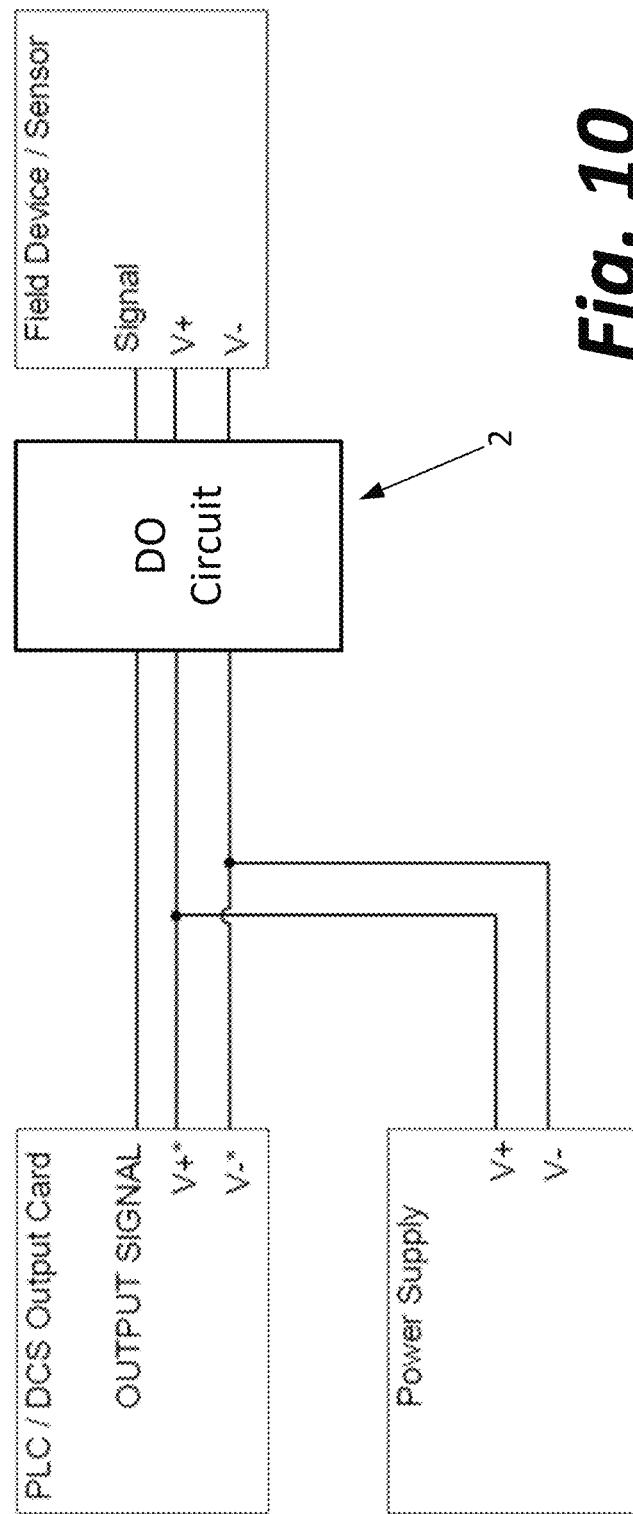
FIG. 10 is a schematic diagram showing the DO of FIG. 4 connected between an output card of a PLC and a field device.

As shown in FIG. 9, the DI 1 is connected between an input card of a PLC and a field device (and most typically a sensor of a field device). As shown in FIG. 10, the DO 2 is connected between an output card of a PLC and a field device (e.g., an actuator such as a solenoid of a field device). While FIGS. 9 and 10 shown the DI 1 and the DO 2 as separate elements, these can be integrated into either the PLC or the field device.

DI 1 shown in FIG. 1 comprises a first controller 10, a first buffer 12, a pull-up resistor 14 and a pull-down resistor 16. The first controller 10 is adapted to actuate four MOSFET switches, specifically, a first pull-up switch 18, a first pull-down switch 20, a drive-up switch 22 and a drive-down switch 24. The DI 1 also includes three ports, a first positive supply (V+) 25, a first voltage return (V−) 26, and a first signal 27.

The DO 2 shown in FIG. 4 comprises a second processor 30, a second buffer 32, and a pull-up/down resistor 34. The controller 30 is adapted to actuate two MOSFET switches, specifically, a second pull-up switch 36 and a second pull-down switch 38. The DO 2 also contains three ports, specifically, a second positive supply (V+) 40, a second voltage return (V−) 43 and a second signal 44.

While FIGS. 1 and 4 show two separate controllers 10 and 30, other embodiments of the invention may include a single controller combining the functions of controllers 10 and 30. In still other embodiments, the functions performed by controllers 10 and 30 may be performed by a controller of a PLC or a controller of a field device.

Figure 2:
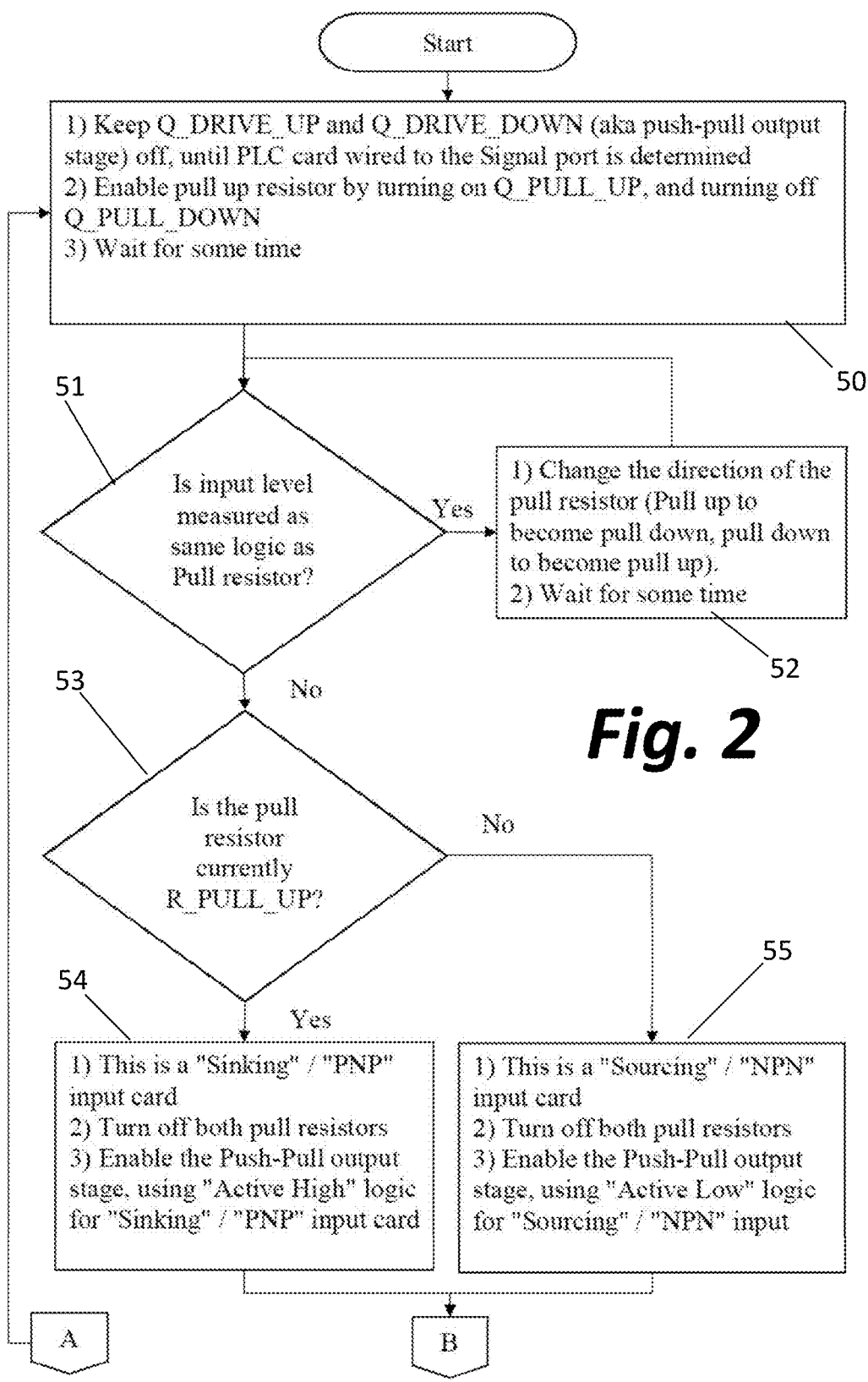
FIGS. 2-3 together illustrate a flow chart identifying the steps employed by the DI of FIG. 1 to ascertain the proper connection between the input card of a PLC and the output of a sensor.
Figure 3:
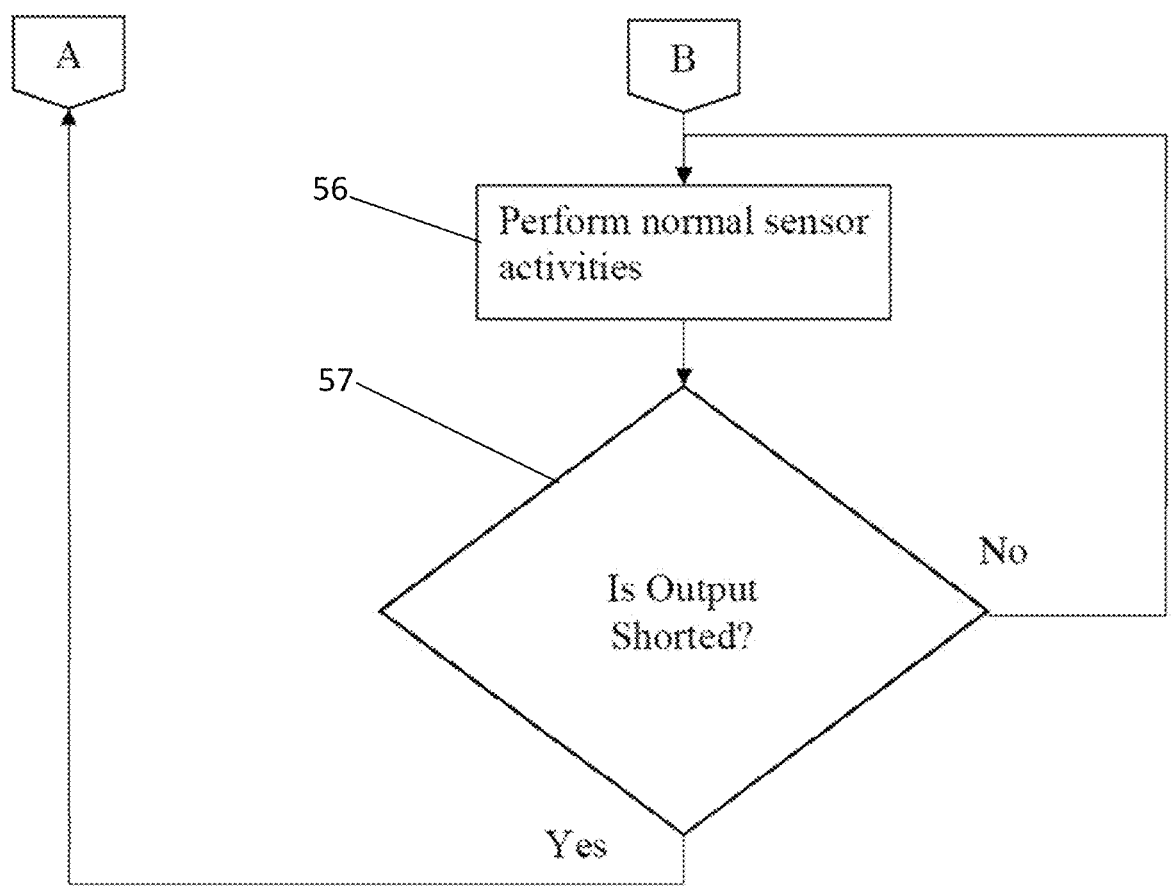

In the embodiment shown in the drawings, the controller 10 causes the apparatus to perform a series of steps to ascertain the type of input card of a PLC to which a sensor is connected. These steps are illustrated in FIGS. 2 and 3.

At step 50, the controller 10 turns both switch 22 and switch 24 off. Switches 22 and 24 are held in their off (non-conducting) state until the type of PLC card wired to signal port 27 is determined. Current is made to flow through resistor 14 by closing switch 18 and opening switch 20, thereby placing a signal to the controller 10 via buffer 12.

After a predetermined time, the controller 10 performs step 51. More specifically, the buffer 12 reads the voltage and converts it to a logical 1 or 0 which is delivered to the controller 10. The controller 10 determines whether the input level is the same logic as established by the activated pull resistor (i.e., either resistor 14 or resistor 16) and buffer 12. If so, the controller 10 performs step 52. If not, the controller performs step 53.

At step 52, the switches 18 and 20 are actuated to effectively change which pull resistor 14 or 16 is in use, whereby pull-up becomes pull-down and vice versa. After a predetermined interval, step 51 is repeated. If the input level at 27 is now different logic than at the activated pull resistor (i.e., either resistor 14 or resistor 16), the controller 10 performs step 53 to identify whether resistor 14 or resistor 16 is then activated. If resistor 14 is activated, the controller 10 knows that the signal port 27 is attached to a sinking/PNP input card of the PLC and the controller 10 performs step 54. If resistor 16 is activated, the controller 10 knows that the signal 27 is attached to a sourcing/NPN card of the PLC and controller 10 performs step 55.

Both steps 54 and 55 include opening both MOSFET switches 18 and 20 to block current flow through the two resistors 14 and 16. Step 54 includes the additional step of enabling the switches 22 and 24 using "active high" logic for the sinking/PNP input card of the PLC attached to the sensor. (In a PNP input card there is a sinking resistor tied to ground.) Step 55 includes alternative additional step of using "active low" logic for the sourcing/NPN input card of the PLC attached to the sensor. (In an NPN input card, there is a sourcing resister tied to high.)

After either step 54 or 55 has been performed, the controller 10 continues by performing normal sensor activity at step 56. The controller 10 also performs a test at step 57 to ascertain whether the output of the sensor is shorted. While a user is wiring a device, the user may at first have the device's signal wire connected temporarily (by user error) to the V+ or V− of the power supply, which would make the self-learning algorithm make an incorrect determination. By re-starting the test, it ensures that it will determine the correct card type, even if the user accidently short-circuits the signal wire. So long as no short is detected, the controller 10 continuously performs normal sensor activities. If any short is detected by the controller 10, the controller 10 returns to step 50 and repeats the process including steps 50-56 described above.

Further, the controller 30 performs the steps illustrated in FIGS. 5-8. Specifically, at step 60, resistor 34 is turned on by closing switch 38. In this condition, the signal 44 is sinking current and thus looking for a PNP style output card of a PLC. The controller 30 waits a predetermined time interval before proceeding to step 62.

At step 62, the controller 30 ascertains whether the input level has the same logic as the resistor 34. If so, step 63 is performed such that switches 36 and 38 are actuated to effectively change the direction of the resistor 34 whereby pull-up becomes pull-down and vice versa. After predetermined time interval, step 62 is performed again.

When at step 62 the controller 30 determines the input level is not the same logic as the resistor 34, the controller performs the test at step 64. At step 64, the controller determines if resistor 34 is then being driven by switch 36 or switch 38. The controller 30 next performs step 65 if switch 38 is driving resistor 34 and step 66 if switch 36 is driving resistor 34. More specifically, if switch 38 is driving resistor 34, the PLC's output card is determined to be either a sourcing/PNP output card or a push-pull output card. The PLC's output card is either a sinking/NPN output card or a push-pull output card if switch 36 is driving resistor 34.

When step 65 is performed, switch 38 is left closed and switch 36 is left open. Alternatively, when step 66 is performed, switch 36 is left closed and switch 38 is left open. In either case, enough current is drawn for the circuit to be compatible with diagnostic type output cards (those which leak current when off, looking for an open circuit) and the controller proceeds to step 67.

Normal sensor activities are performed at step 67 and the controller periodically performs step 68 to identify whether there has been a change in the input logic state, indicating it is now the correct time to test for a push-pull type output card. So long as no change in the state of the input logic is detected, the controller continues to perform steps 67 and 68.

As soon as a change in the input logic state is detected, the controller performs step 69. Here, the controller checks to see if step 65 or step 66 was last performed. If step 65, the controller 30 next performs step 70. If step 66, the controller 30 next performs step 71. Steps 70 and 71 allow the controller to ascertain if the PLC's output card is a push-pull output card. When performing step 70, switch 38 is turned off and switch 36 is turned on. Alternatively, when step 71 is performed, switch 38 is turned on and switch 36 is turned off.

After performing either step 70 or 71, the controller 30 waits a predetermined time interval and then performs step 72 and again looks to see if the input logic is the same as at the resistor 34. If so, the PLC's output card is determined by the controller 30 at step 73, to not be a push-pull card. Hence, the PLC's output card is either a source/PNP output card or a sinking/NPN card as was previously determined at steps 65 and 66. The controller 30 then performs step 75.

Alternatively, if at step 72 the controller 30 determines the input logic not to be the same as the resistor 34, at step 74 the controller 30 identifies the PLC's output card to be a push-pull card. The controller then performs step 76.

At step 75, the controller 30 proceeds to step 77 if the controller 30 previously determined that the PLC's output card is a source/PNP card and to step 78 if the PLC's output card was previously determined to be a sinking/NPN card. If the PLC's output card is a sourcing/PNP card, switch 36 is opened and switch 38 is closed at step 77. If a sinking/NPN card was detected, switch 36 is closed and switch 38 is opened at step 78. If the PLC's output card is a push-pull output card, at step 76, the push-pull output card is assumed to be active high logic and the controller 30 closes switch 38 and opens switch 36. This assumption is made given the way most push-pull output cards are fabricated. If this assumption proves to be incorrect, the internal programming of the PLC and/or output card can be reprogrammed so that this assumption is true. After performing the proper step of steps 76, 77 and 78, the controller 30 performs normal control activities at step 80.

One skilled in the art will appreciate from the forgoing that the circuits of FIGS. 1 and 4 and the program executing the operations reflected in the flow charts of FIGS. 2-3 and 5-8 combine to achieve two important results. First, the types of input and output card of the PLC to which the field device is attached are identified. Second, proper connections are established between those input and output cards and the field device.

One skilled in the art will further appreciate that modifications may be made without deviating from the invention. For example, the DI and DO circuits described above may be incorporated into the circuitry of a PLC card. More specifically, one or more DI circuits 1 may be integrated into a PLC output card. This is because the "DI" circuit transmits data to the input of another device such as a field device. The PLC Output card sends data to the input of a field device to control the actuators of the field device. In other cases, the PLC output card just provides power to a field device. Three such DI circuits are incorporated into a PLC output card in the example illustrated in FIG. 12. These DI circuits are separately coupled to three separate actuators. These actuators may be a part of the same field device or three separate field devices.

Figure 11:
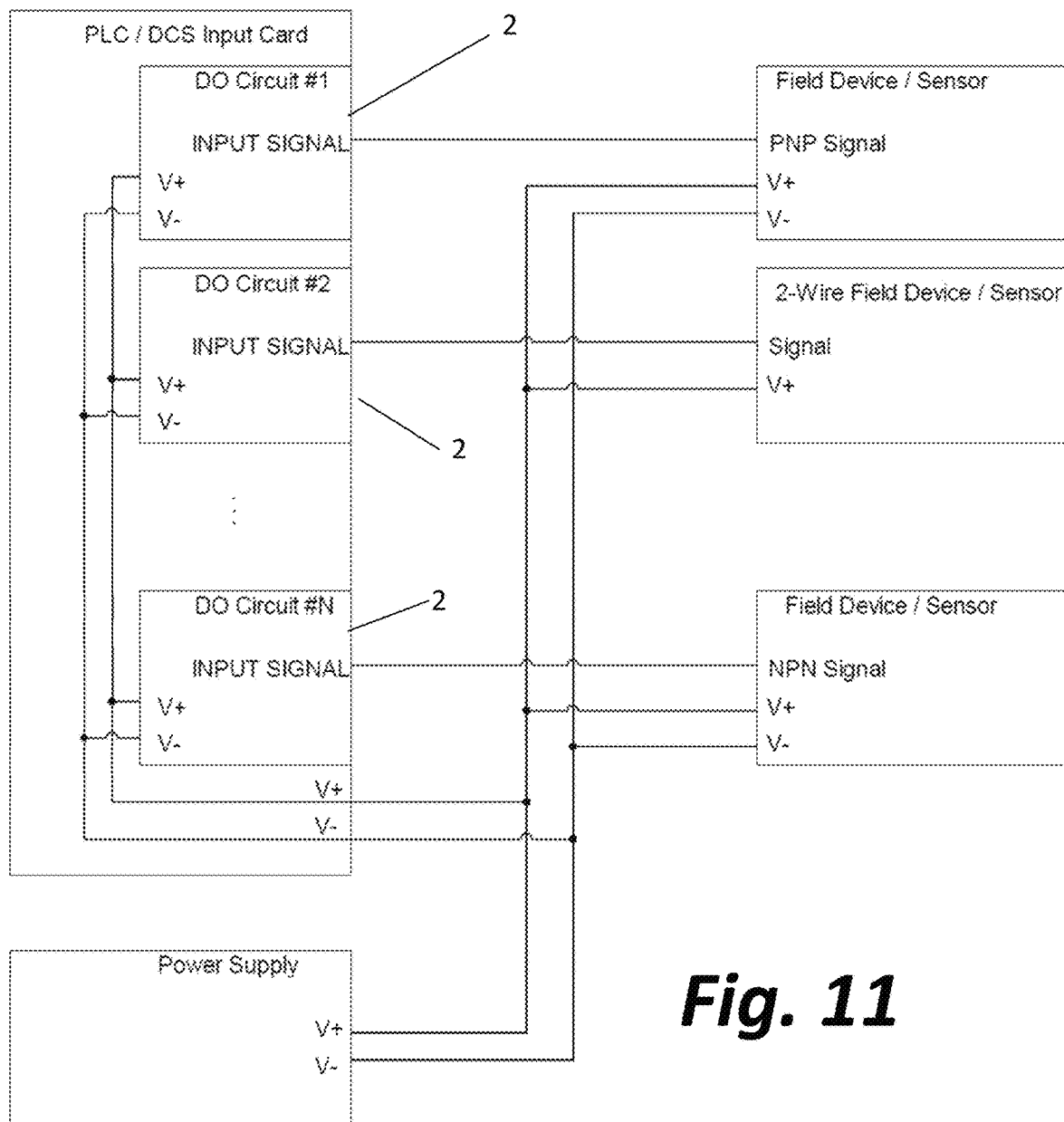
FIG. 11 is a schematic diagram illustrating three DO circuits of the type shown in FIG. 4 integrated into a PLC input card with the PLC input card coupled to three different field device sensors which may be part of a single field device or three separate field devices.
Figure 12:
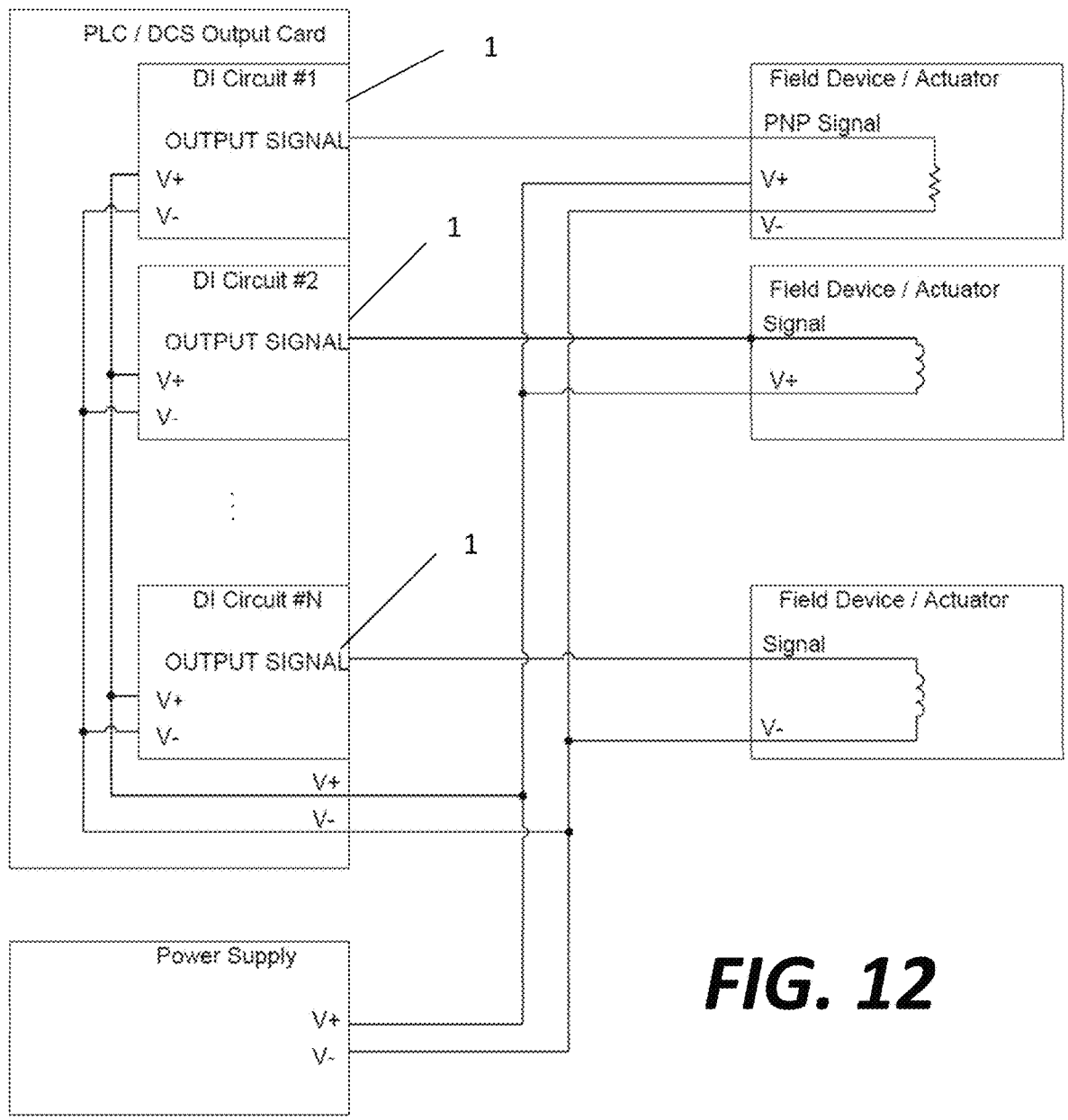
FIG. 12 is a schematic diagram illustrating three DI circuits of the type shown in FIG. 1 integrated into a PLC output card with the PLC output card coupled to three separate actuators which may be a part of a single field device or three different field devices.

Likewise, the DO circuitry may be integrated into a PLC input card. This is because the DO circuit receives data from the output of another device enabling the PLC input card to receive data from the output of field devices. FIG. 11 illustrates an example in which three DO circuits 2 are integrated into a PLC input card. Each DO circuit 2 is connected to a separate sensor of a field device. These sensors may be part of the same field device or three separate field devices.

Figure 13:
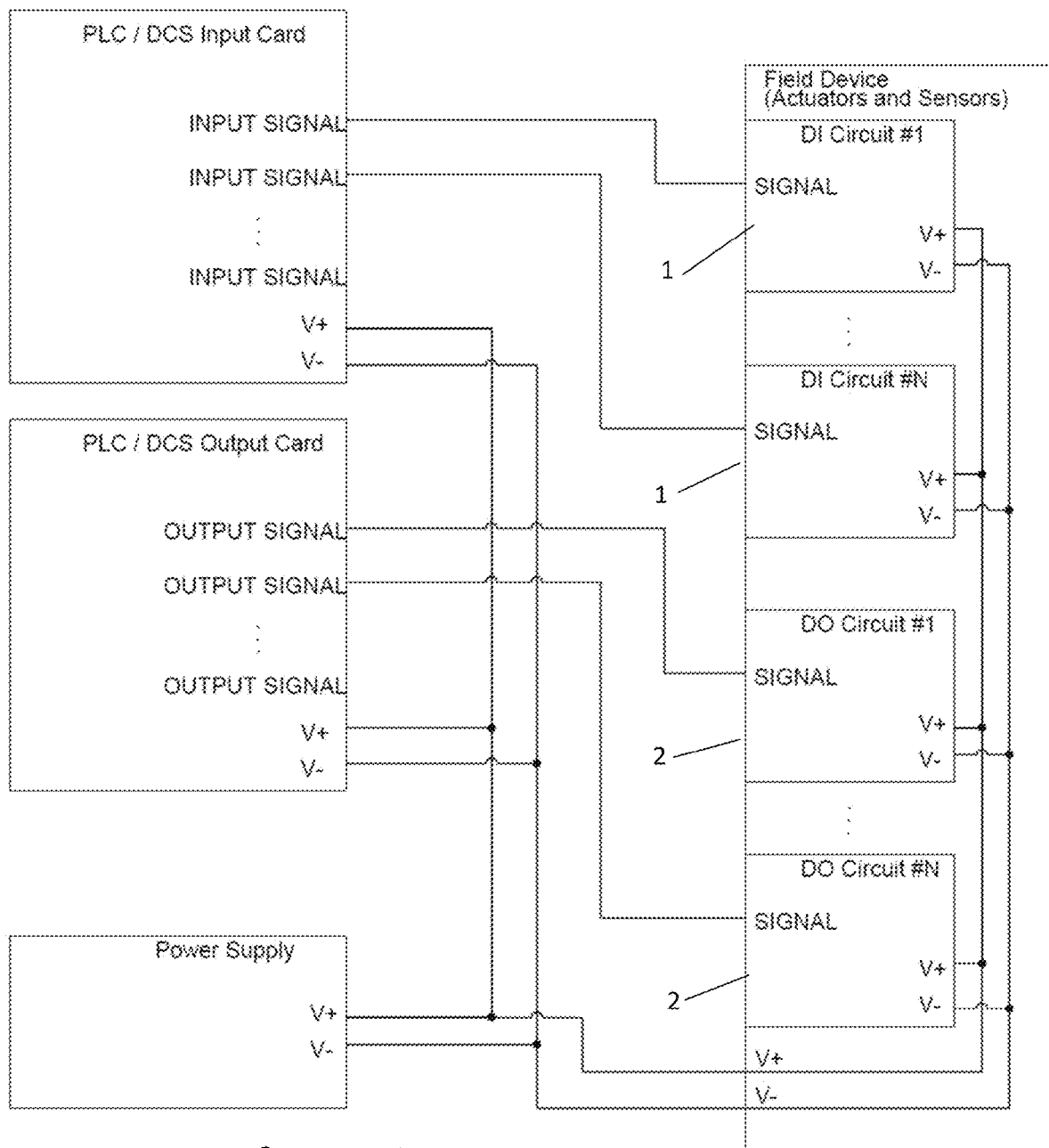
FIG. 13 is a schematic diagram showing a field device into which two DI circuits of the type shown in FIG. 1 and two DO circuits of the type shown in FIG. 4 are integrated, the DI circuits being employed to couple separate sensors of the field device to a PLC input card, and the DO circuits being employed to couple separate actuators to a PLC output card.

FIG. 13 shows two DI circuits 1 and two DO circuits 2 integrated into a field device having two actuators and two sensors. The DI circuits 1 are used to couple the sensors of the field device to the PLC input card(s) of the PLC. The DO circuits 2 are employed to connect the two actuators of the field device to the PLC output card(s) of a PLC.

This invention has been described herein in considerable detail in order to comply with the patent statutes and to provide those skilled in the art with the information needed to apply the novel principles and to construct and use embodiments of the example as required. However, it is to be understood that the invention can be carried out by specifically different devices and that various modifications can be accomplished without departing from the scope of the invention itself.

What is claimed is:

1. For determining a type of card used by a programmable logic controller (PLC) to connect an output of a sensor of a field device to the PLC, an apparatus comprising a first controller, at least one positive voltage supply, at least one negative voltage return, and discrete input circuitry (DI), said DI comprising a first buffer, a pull-up resistor, a pull-down resistor, a first pull-up switch, a first pull-down switch, a drive-up switch, a drive-down switch, and a first signal port, wherein said controller is adapted to (a) determine whether the output of the sensor is shorted, (b) perform normal sensor activity if the output of the sensor is not shorted, and (c) if the output of the sensor is shorted or upon apparatus initialization (i) turn off both the drive-up switch and the drive-down switch; (ii) actuate the first pull-up switch and the pull-down switch to selectively activate one of the pull-up resistor or the pull-down resistor to provide a pull influence signal to the controller via buffer; (iii) compare the input level at the signal port to the pull influence signal, (iv) when the input level and the pull influence signal are the same, actuate the first pull-up switch or the pull-down switch to selectively activate the other of the pull-up resistor or the pull-down resistor to provide a pull influence signal to the controller 10 via buffer, (v) continue with additional sub-step (iv) until the input level is different than the pull influence signal, (vi) when the input level is different than the pull influence signal determine whether the card is a sinking/PNP card which will be the case if the pull-up resistor is active or a sourcing/NPN card which will be the case if the pull-down resistor is active, (vii) selectively configure both first pull-up switch and first pull-down switch and the drive-up switch and the drive-down switch such that the output is compatible with the detected card type.

2. The apparatus of claim 1 wherein the apparatus further comprises discrete output circuitry (DO), said DO comprising a second buffer, a pull-up/down resistor, a second pull-up switch, a second pull-down switch, and a second signal port.

3. The apparatus of claim 2 wherein, when the DO is attached to a PLC output card, said first controller is further adapted to control the second pull-up switch and the second pull-down switch of the DO to perform tests enabling the controller to ascertain the type of PLC output card to which the DO is attached.

4. The apparatus of claim 2 further comprising a second controller.

5. The apparatus of claim 4 wherein, when said DO is attached to a PLC output card, said second controller is adapted to control the second pull-up switch and the second pull-down switch of the DO to perform tests enabling the second controller to ascertain the type of PLC output card to which the DO is attached.

6. The apparatus of claim 1 wherein said first controller also controls a field device.

7. The apparatus of claim 1 wherein said first controller also controls a PLC.

8. For determining the types of cards used by a programmable logic controller (PLC) for connecting an input of a field device to a PLC, an apparatus comprising a first controller, at least one positive voltage supply, at least one negative voltage return, and discrete output circuitry (DO), said DO comprising a first buffer, a pull-up/down resistor, a pull-up switch, a pull-down switch, and a signal port, wherein said controller is adapted to (i) determine an input level, enable the pull-up/down resistor by closing switch to provide a pull influence input signal, wait a predetermined period of time and ascertain whether the input level is the same as the pull-up/down influence signal; (ii) if the input level is the same as the pull-up/down influence signal, actuate pull-up switch and pull-down switch to change the direction of pull-up/down resistor and after a predetermined period of time ascertain whether the input level is the same as the pull-up/down influence signal; (iii) continue with additional sub-step (ii) until the input level is different than the pull-up/down influence; (iv) whenever the input level is not the same as the pull-up/down influence signal, determine whether the pull-up/down resistor is being driven by pull-up switch, in which case the output card is either a sinking/NPN output card or a push-pull output card, or driven by pull-down switch, in which case the output card is either a sourcing/PNP card or a push-pull output card; (v) perform normal field device activity while monitoring the input signal for a change in the input level; (vi) when a change in the input level is detected and the pull-up/down resistor is being driven by pull-up switch, set pull-up switch to off and pull-down switch to on, and when a change in the input level is detected and the pull-up/down resistor is being driven by pull-down switch, set pull-up switch to on and pull-down switch to off; (vii) determine whether the input level is the same as the pull-up/down influence signal in which case the output card is not a push-pull card or different than the pull-up/down influence signal in which case the output card is a push-pull card; (viii) selectively configure the pull-up switch and pull-down switch 38 such that pull-up/down resistor is compatible with the detected card type; (ix) and perform normal field device activity.

9. The apparatus of claim 8 wherein, when the DO is attached to a PLC output card, said first controller is adapted to control the pull-up switch and the pull-down switch of the DO to perform tests enabling the controller to ascertain the type of PLC output card to which the DO is attached.

10. For determining the types of cards used by a programmable logic controller (PLC) for properly connecting a field device, said field device having a sensor producing an output, to a PLC, an apparatus comprising a controller, a connection of a positive voltage supply, a negative voltage return, a discrete input circuit (DI) for determining the type of an input card used by the PLC, and a discrete output circuit (DO) for determining the type of an output card used by the PLC, said DI comprising a first buffer, a pull-up resistor, a pull-down resistor, a first pull-up switch, a first pull-down switch, a series connection of a drive-up switch and a drive-down switch connected between the positive voltage supply and the negative voltage return, and a first signal port connected to a first junction point between the pull-up resistor and the pull-down resistor, a second junction point between the drive-up switch and the drive-down switch and to an input of said first buffer and where said controller is connected in controlling relation to each of the first pull-up switch, first pull-down switch, drive-up switch and drive-down switch, said DO comprising a second buffer, a pull-up/down resistor, a second pull-up switch, a second pull-down switch, and a second signal port, the second signal port being coupled by the pull up/down resistor to a junction point between a series connection of the pull-up switch and the pull-down switch connected between the positive voltage supply and the negative voltage return and where an input to the second buffer is tied to the second signal port, the controller providing control inputs to the second pull-up switch and the second pull-down switch; wherein said controller and DI are adapted to (a) determine whether the output of the sensor is shorted, (b) perform normal sensor activity if the output of the sensor is not shorted, and (c) if the output of the sensor is shorted or upon apparatus initialization (i) turn off both the drive-up switch and the drive-down switch; (ii) actuate the first pull-up switch and the pull-down switch to selectively activate one of the pull-up resistor or the pull-down resistor to provide a pull influence signal to the controller via buffer; (iii) compare the input level at the signal port to the pull influence signal, (iv) when the input level and the pull influence signal are the same, actuate the first pull-up switch or the pull-down switch to selectively activate the other of the pull-up resistor or the pull-down resistor to provide a pull influence signal to the controller via buffer, (v) continue with additional sub-step (iv) until the input level is different than the pull influence signal, (vi) when the input level is different than the pull influence signal determine whether the card is a sinking/PNP card which will be the case if the pull-up resistor is active or a sourcing/NPN card which will be the case if the pull-down resistor is active, (vii) selectively configure both first pull-up switch and first pull-down switch and the drive-up switch and the drive-down switch such that the output is compatible with the detected card type; and wherein the controller and DO are adapted to (i) determine an input level, enable the pull-up/down resistor by closing switch to provide a pull influence input signal, wait a predetermined period of time and ascertain whether the input level is the same as the pull-up/down influence signal; (ii) if the input level is the same as the pull-up/down influence signal, actuate pull-up switch and pull-down switch to change the direction of pull-up/down resistor and after a predetermined period of time ascertain whether the input level is the same as the pull-up/down influence signal; (iii) continue with additional sub-step (ii) until the input level is different than the pull-up/down influence; (iv) whenever the input level is not the same as the pull-up/down influence signal, determine whether the pull-up/down resistor is being driven by pull-up switch, in which case the output card is either a sinking/NPN output card or a push-pull output card, or driven by pull-down switch, in which case the output card is either a sourcing/PNP card or a push-pull output card; (v) perform normal field device activity while monitoring the input signal for a change in the input level; (vi) when a change in the input level is detected and the pull-up/down resistor is being driven by pull-up switch, set pull-up switch to off and pull-down switch to on, and when a change in the input level is detected and the pull-up/down resistor is being driven by pull-down switch, set pull-up switch to on and pull-down switch to off, (vii) determine whether the input level is the same as the pull-up/down influence signal in which case the output card is not a push-pull card or different than the pull-up/down influence signal in which case the output card is a push-pull card; (viii) selectively configure the pull-up switch and pull-down switch such that pull-up/down resistor is compatible with the detected card type; (ix) and perform normal field device activity.

11. The apparatus of claim 1 wherein apparatus comprises a plurality of DI circuits, each of said DI circuits adapted to be coupled to a separate PLC input card and identify the type of PLC input card to which it is coupled.

12. The apparatus of claim 8 wherein apparatus comprises a plurality of DO circuits, each of said DO circuits adapted to be coupled to a separate PLC output card and identify the type of PLC output card to which it is coupled.

13. A method for determining a type of input card used by a programmable logic controller (PLC) to connect a field device to the PLC, the method comprising:
 a. providing an apparatus comprising a controller, at least one positive voltage supply, at least one negative voltage return, discrete input circuitry (DI), said DI comprising a first buffer, a pull-up resistor, a pull-down resistor, a first pull-up switch, a first pull-down switch, a drive-up switch, a drive-down switch, and a first signal port;
 b. attaching the DI to a PLC input card,
 c. determining the type of PLC input card to which the DI is attached by (i) actuating the first pull-up switch and the pull-down switch to selectively activate one of the pull-up resistor and the pull-down resistor to provide a first influence signal to the controller via buffer; (ii) comparing the input level at the first signal port to the first influence signal, (iii) when the input level and the first influence signal are the same, actuate the pull-up switch and pull-down switch to selectively activate the other of the pull-up resistor and the pull-down resistor to provide a second influence signal to the controller via buffer, (iv) when the input level and the second influence signal are different, determine whether the card is a sinking/PNP card which will be the case if the pull-up resistor is active or a sourcing/NPN card which will be the case if the pull-down resistor is active.

14. The method of claim 13 including the additional steps of connecting a field device to the apparatus and of performing normal sensing and control activities.

15. A method for determining a type of output card used by a programmable logic controller (PLC) to connect a field device to the PLC, the method comprising:
 a. providing an apparatus comprising a controller, at least one positive voltage supply, at least one negative voltage return, and discrete output circuitry (DO), said DO comprising a buffer, a pull-up/down resistor, a pull-up switch, a pull-down switch, and a signal port;

b. attaching the DO to a PLC output card; and c. determining the type of PLC output card to which the DO is attached by (i) determining an input level, enabling the pull-up/down resistor by closing switch to provide a pull influence input signal, waiting a predetermined period of time and ascertaining whether the input level is the same as the pull-up/down influence signal; (ii) if the input level is the same as the pull-up/down influence signal, actuating pull-up switch and pull-down switch to change the direction of pull-up/down resistor and after a predetermined period of time ascertaining whether the input level is the same as the pull-up/down influence signal; (iii) continuing with additional sub-step (ii) until the input level is different than the pull-up/down influence; (iv) whenever the input level is not the same as the pull-up/down influence signal, determining whether the pull-up/down resistor is being driven by pull-up switch, in which case the output card is either a sinking/NPN output card or a push-pull output card, or driven by pull-down switch, in which case the output card is either a sourcing/PNP card or a push-pull output card; (v) performing normal field device activity while monitoring the input signal for a change in the input level; (vi) when a change in the input level is detected and the pull-up/down resistor is being driven by pull-up switch, setting pull-up switch to off and pull-down switch to on, and when a change in the input level is detected and the pull-up/down resistor is being driven by pull-down switch, setting pull-up switch to on and pull-down switch to off, (vii) determining whether the input level is the same as the pull-up/down influence signal in which case the output card is not a push-pull card or different than the pull-up/down influence signal in which case the output card is a push-pull card; (viii) selectively configuring the pull-up switch and pull-down switch such that pull-up/down resistor is compatible with the detected card type; (ix) and performing normal field device activity.

16. The apparatus of claim 1 wherein said apparatus is integrated into a PLC output card.

17. The apparatus of claim 1 wherein the apparatus is attached to a PLC input card.

18. The apparatus of claim 8 wherein said apparatus is integrated into a PLC input card.

19. The apparatus of claim 8 wherein said apparatus is attached to a PLC output card.

20. The apparatus of claim 8 wherein said first controller also controls a field device.

21. The apparatus of claim 8 wherein said first controller also controls a PLC.

\* \* \* \* \*